United States Patent

Kamon et al.

[11] Patent Number: 5,279,911
[45] Date of Patent: Jan. 18, 1994

[54] PHOTOMASK

[75] Inventors: Kazuya Kamon; Hitoshi Nagata, both of Itami, Japan

[73] Assignee: Mitsubishi Denki Kabushiki Kaisha, Tokyo, Japan

[21] Appl. No.: 793,319

[22] Filed: Nov. 15, 1991

Related U.S. Application Data

[63] Continuation of Ser. No. 611,912, Nov. 13, 1990, abandoned.

[30] Foreign Application Priority Data

Jul. 23, 1990 [JP] Japan ................... 2-197474

[51] Int. Cl.$^5$ ................................... G03F 1/00
[52] U.S. Cl. ........................... 430/5; 430/22; 430/311; 430/396
[58] Field of Search ............ 430/5, 221, 275, 311, 430/396; 427/164, 165

[56] References Cited

U.S. PATENT DOCUMENTS

| | | | |
|---|---|---|---|
| 4,764,441 | 8/1988 | Ohta et al. | 430/5 |
| 4,873,163 | 10/1989 | Watakabe et al. | 430/5 |
| 4,923,772 | 5/1990 | Kirch et al. | 430/5 |
| 5,045,417 | 9/1991 | Okamoto | 430/396 |

FOREIGN PATENT DOCUMENTS

| | | | |
|---|---|---|---|
| 0121441 | 9/1980 | Japan | 430/5 |
| 0110939 | 9/1981 | Japan | 430/5 |
| 0167025 | 10/1982 | Japan | 430/5 |
| 62-67514 | 3/1987 | Japan | |
| 0214859 | 8/1989 | Japan | 430/5 |

*Primary Examiner*—Marion E. McCamish
*Assistant Examiner*—Kathleen Duda
*Attorney, Agent, or Firm*—Oblon, Spivak, McClelland, Maier & Neustadt

[57] ABSTRACT

According to the inventive photomask, a light shielding pattern as well as a high reflection film are formed at one major surface side of a transparent substrate. Thus, a focal position in a resist film with respect to light directly passing through the high reflection film is separated from a focal position in the resist film with respect to light multiple-reflected by the high reflection film along the thickness direction of the resist film, whereby the depth of focus is enlarged as the result.

20 Claims, 6 Drawing Sheets

PHOTOMASK

This application is a continuation of application Ser. No. 07/611,912, filed on Nov. 13, 1990, now abandoned.

BACKGROUND OF THE INVENTION

1. Field of the Invention

The present invention relates to a photomask, which is employed for working a workpiece such as a semiconductor wafer through a lithographic technique.

2. Description of the Prior Art

FIG. 9 is a schematic block diagram of an exposure apparatus including a photomask which is generally used in a photolithographic process, and FIG. 10 is an enlarged view of its essential part.

As shown in these FIGURES, light $L_1$ output from a light source 1 is focused by a lens system 2 and emitted onto a photomask 3. In the photomask 3, a light shielding pattern 5 is formed on one major surface of a transparent substrate 4, so that light entering a region corresponding to the light shielding pattern 5 is cut off within light $L_2$ which is incident upon the photomask 3, while light entering the remaining region is transmitted. Light $L_3$ selectively transmitted through the photomask 3 is collected within a resist film 8 which is formed on a substrate 7 serving as a workpiece, through a projecting lens system 6 of a magnification m, for example. Thus, the resist film 8 is partially photosensitized so that the mask pattern is transferred onto the resist film 8.

The conventional photomask 3 is formed in the aforementioned manner, and light $L_3$ selectively transmitted through the photomask 3 forms an image on a focal plane 9 including a converging point P (plane perpendicular to the optical axis of the lens system 6 through the converging plane P) through the lens system 6. In this case, a prescribed depth of focus DOF expressed in the following equation is recognized in the lens system 6 with respect to light of a wavelength $\lambda$, assuming that NA represents its numerical aperture:

$$DOF \propto \frac{\lambda}{(NA)^2} \quad (1)$$

Since the resist film 8 is substantially photosensitized within the range of the aforementioned depth of focus DOF about the focal plane 9 along the thickness direction of the resist film 8, it is preferable that the value of the depth of focus DOF is sufficiently large with respect to the thickness of the resist film 8.

With recent refinement of LSI, however, the numerical aperture NA tends to increase in consideration of the converging ability of the lens system 6. Consequently, the depth of focus DOF tends to decrease to the contrary. In a current manufacturing process for LSI, a lens system 6 having a numerical aperture NA of about 0.54 may be used for ultraviolet rays of 436 nm in wavelength $\lambda$. for example, and in this case, the depth of focus DOF is about 1.5 $\mu$m from the above equation (1). On the other hand, the thickness of the resist film 8 is also about 1.5 $\mu$m, substantially equally to the depth of focus DOF. Therefore, accuracy is required for the exposure apparatus in order to correctly locate the resist film 8 within the depth of focus DOF, while accuracy is also required for an operation for setting the workpiece, and a defectively photosensitized region is caused in the resist film 8 upon merely a slight reduction of such accuracy.

SUMMARY OF THE INVENTION

The present invention is directed to a photomask which is employed for transferring a prescribed pattern onto a resist film provided on a workpiece through a lithographic technique. The inventive photomask comprises a transparent substrate, a light shielding pattern which is formed at one major surface side of the transparent substrate, and a high reflection film which is formed at one major surface side of the transparent substrate for enlarging the depth of focus within the resist film by partially multiple-reflecting light passing between the light shielding pattern.

Accordingly, an object of the present invention is to provide a photomask which can enlarge the depth of focus.

According to the inventive photomask, the high reflection film is formed at one major surface side of the transparent substrate, whereby a focal position in the resist film with respect to light directly transmitted through the high reflection film is separated from a focal position in the resist film with respect to the light multiple reflected by the high reflection film along the thickness direction of the resist film. Consequently, the depth of focus is enlarged.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
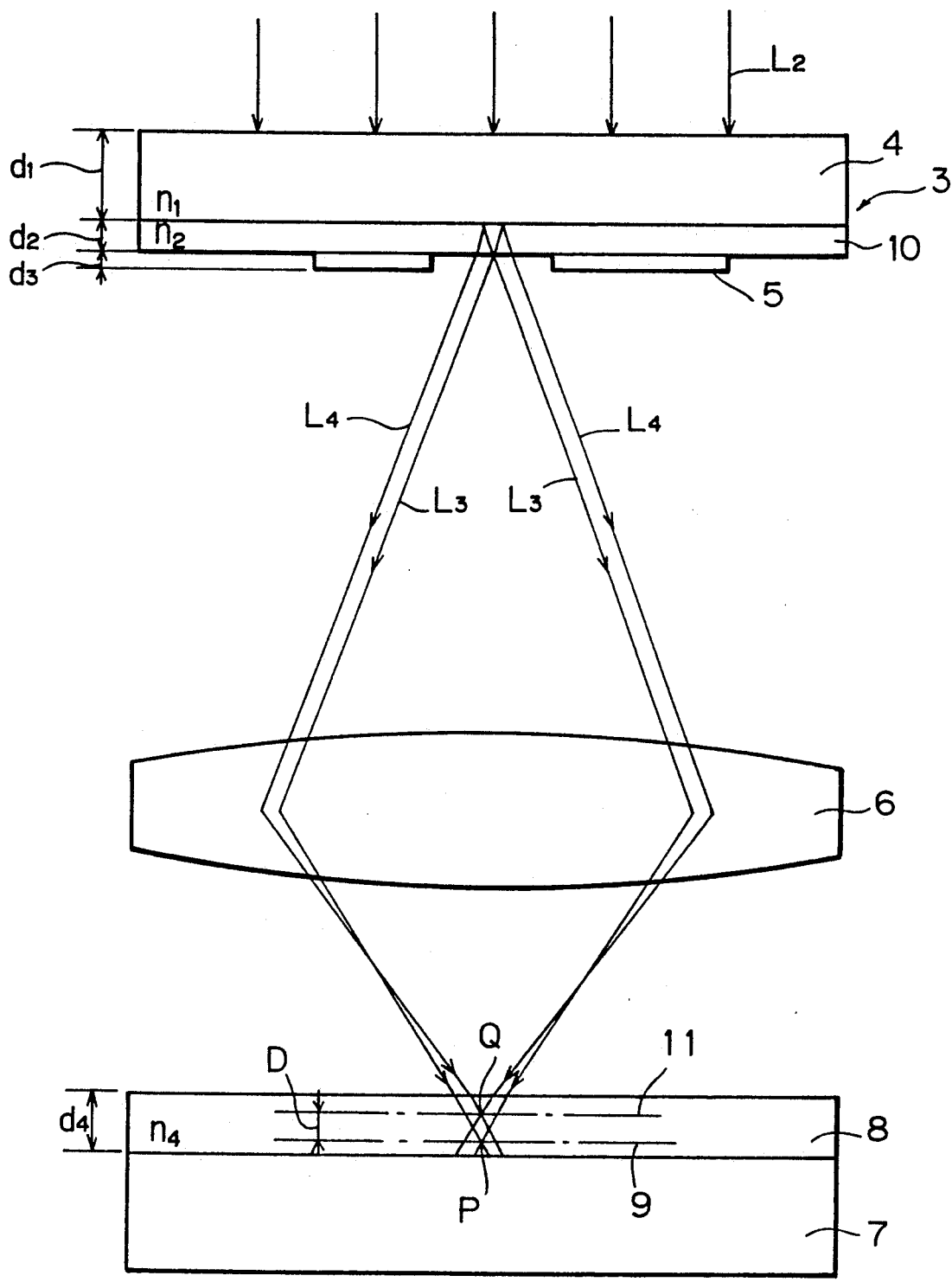
FIG. 1 is a block diagram showing an essential part of an exposure apparatus including a photomask according to a first embodiment of the present invention.
Figure 9:
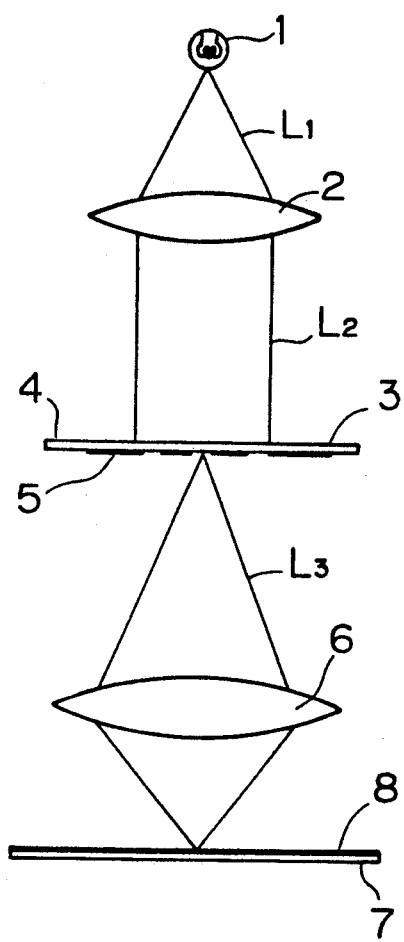
FIG. 9 is a schematic block diagram showing an exposure apparatus including a photomask generally employed in a photolithographic process.

FIG. 1 is a block diagram showing an essential part of an exposure apparatus including a photomask according to a first embodiment of the present invention. The components of this exposure apparatus are identical to those of the apparatus shown in FIG. 9, and hence the same or corresponding parts are indicated by the same reference numerals.

As shown in FIG. 1, a photomask 3 comprises a transparent substrate 4, a high reflection film 10 which is formed on one major surface of the transparent substrate 4, and a light shielding pattern 5 which is formed on the high reflection film 10.

The transparent substrate 4 is formed of quartz, for example, and its refractive index $n_1$ is 1.47, while its thickness $d_1$ is about 5 mm.

The high reflection film 10 is formed of lead glass, silicon nitride or the like, for example. This high reflection film 10 is preferably formed of a material whose refractive index $n_2$ ia large as compared with the refractive index $n_1$ of the transparent substrate 4 and which has a small light absorbing power. When the refractive index $n_2$ of the high reflection film 10 increases, reflection factors at boundary surfaces between the same and the transparent substrate 4 as well as an air layer increase respectively, to facilitate multiple reflection by the high reflection film When the light absorbing power of the high reflection film decreases, further, absorption of multiple-reflected light in the high reflection film 10 is suppressed. It is preferable to employ LaF2 glass (made by HoYa Kabushiki Kaisha), which is a kind of lead glass, or TaFD6 glass as a material satisfying the aforementioned conditions. When the LaF2 glass is employed, the refractive index $n_2$ is 1.7866, and transmittance with respect to light of 360 nm in wavelength is 0.8. The thickness $d_2$ of the high reflection film 10 is decided in consideration of the depth of focus, as hereinafter described in detail.

The light shielding pattern 5 is formed of Cr, MoSi or the like, and its thickness $d_3$ is generally about 0.1 pm.

A projecting lens system 6 is formed by a plurality of combination lenses, and telecentrically finished with respect to both directions of incidence and output. The magnification m of this lens system is set at 1/5, for example. However, the magnification m is not restricted to the above value, but may be 1/10 or 1, for example.

A resist film 8 formed on a wafer substrate 7, which is a workpiece, is prepared from a generally known resist material. When MCPR2000H (made by Mitsubishi Kasei Kabushiki Kaisha) is employed, for example, its refractive index $n_4$ is 1.68 and its thickness $d_4$ is about 1.5 μm.

In the exposure apparatus including this photomask 3, a light source 1 (see FIG. 9) emits ultraviolet light $L_1$ having a wavelength of 436 nm, for example, so that the light is focused by the lens system 2 and emitted onto the photomask 3 as light $L_2$. This light $L_2$ is incident upon the high reflection film 10 through the transparent substrate 4.

In a region not provided with the light shielding pattern 5, part of the light $L_2$ is directly output toward the lens system 6 as transmitted light $L_3$, while the remaining light is successively reflected by the lower surface and the upper surface of the high reflection film 10, and thereafter output toward the lens system 6 as primary reflected light $L_4$. Since multiple reflection is performed in the high reflection film 10, secondary or higher reflected light is output toward the lens system 6 in addition to the primary reflected light $L_4$, while such secondary or higher reflected light can be neglected in practice since the light intensity thereof is extremely small.

In a region provided with the light shielding pattern 5, on the other hand, transmission of light to the lens system 6 is blocked.

The transmitted light $L_3$ and the primary reflected light $L_4$ thus selectively transmitted through the photomask 3 are collected in a resist film 8 which is formed on the Si substrate 7 through the projecting lens system 6, to form an image.

Figure 10:
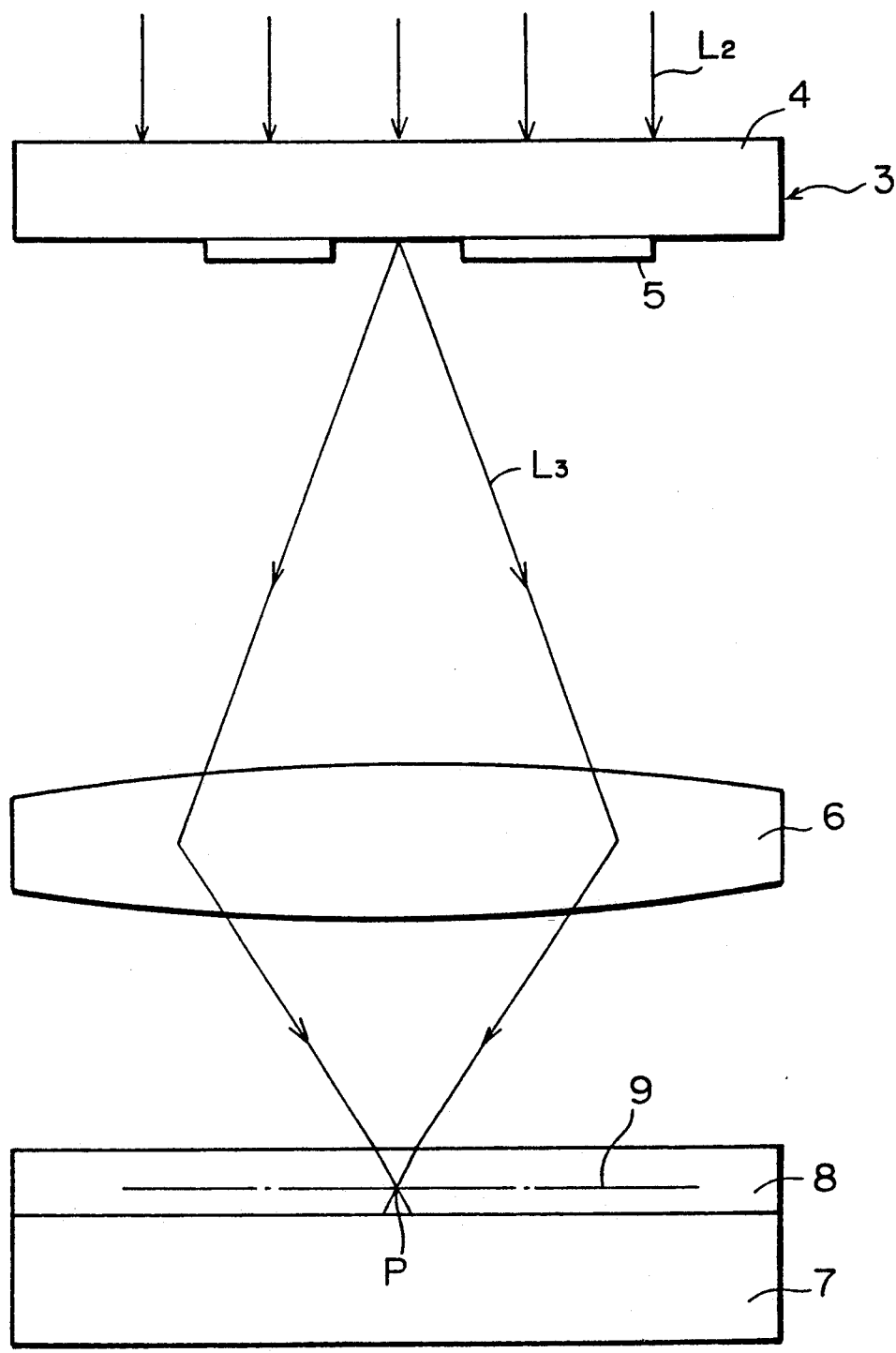
FIG. 10 is an enlarged view showing an essential part thereof.

In this case, the transmitted light $L_3$ forms an image on a focal plane 9 including a converging point P, similarly to the case of the prior art shown in FIG. 10. On the other hand, the primary reflected light $L_4$ forms an image on a focal plane 11 including a point Q, which is separated from the converging point P by a distance D along the direction of the optical axis of the lens system 6, due to the optical path difference caused in the high reflection film 10.

The optical path $n_4 D$ between the points P and Q is expressed, through optical path difference $2n_2 d_2$ caused in the high reflection film 10 and the magnification m of the lens system 6, as follows:

$$n_4 D = m^2 \times (2 n_2 d_2)$$

Hence, the thickness $d_2$ of the high reflection film 10 is:

$$d_2 = \frac{n_4 D}{2 n_2 m^2} \qquad (2)$$

Since the reflective indices $n_2$ and $n_4$ and the magnification m are already known, the thickness $d_2$ is decided if the distance D is recognized.

Figure 2:
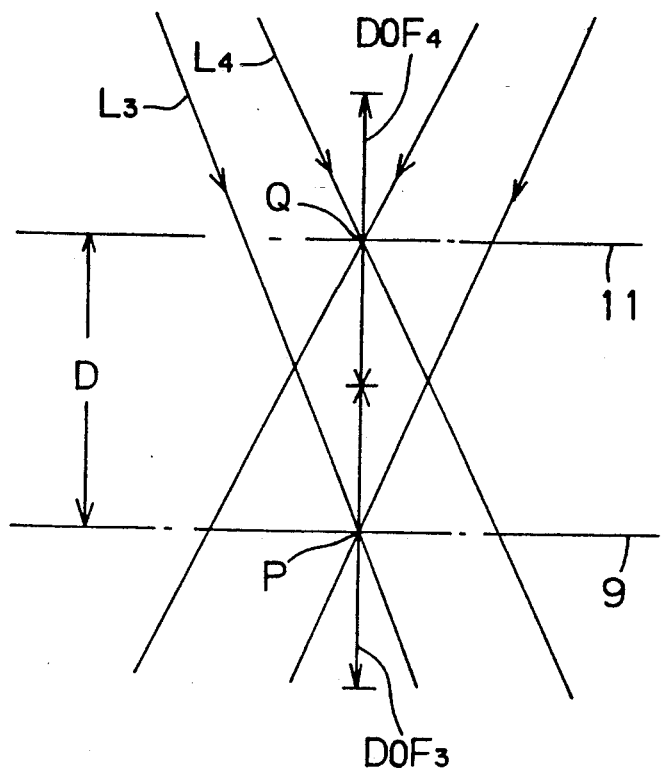
FIG. 2 is a diagram for illustrating enlargement of a depth of focus.

As shown in FIG. 2, the depth of focus by the lens system 6 is recognized in constant ranges respectively expressed as $DOF_3$ and $DOF_4$ about the points P and Q for the respective ones of the transmitted light $L_3$ and the primary reflected light $L_4$. In order to photosensitive the resist film 8 over the entire region along the thickness direction, therefore, &he ranges $DOF_3$ and $DOF_4$ of the depth of focus of the light $L_3$ and the light $L_4$ must be formed in continuation. In other words, it is necessary to satisfy:

$$D \leq \frac{DOF_3}{2} + \frac{DOF_4}{2} \qquad (3)$$

Since the depths of focus $DOF_3$ and $DOF_4$ are expressed by the equation (1) respectively, the above equation (3) can be rewritten as follows:

$$D \leq DOF = \frac{\lambda}{2(NA)^2}$$

Since the numerical aperture NA of the lens system 6 and the wavelength $\lambda$ of the incident light are already known, the distance D is decided by the equation (4) and the thickness $d_2$ of the high reflection film is evaluated from the equation (2). When NA=0.38, $\lambda$=436 nm, $n_2$=1.7866, $n_4$=1.68 and m=1.5, for example, $D \lesssim 1.5$ μm and $d_2 \lesssim 17.6$ μm.

As hereinabove described, the resist film 8 is photosensitized through the transmitted light $L_3$ and the primary reflected light $L_4$ by the high reflection film 10, whereby the depth of focus can be doubled at the maximum, as compared with the conventional case.

FIGS. 3 to 6 illustrate modifications of the aforementioned photomask 3 respectively.

Figure 3:
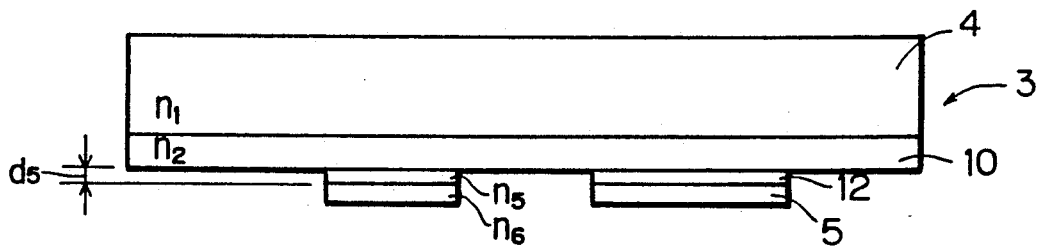
FIGS. 3 to 6 are diagrams showing modifications of the photomask according to the first embodiment respectively.

A photomask 3 shown in FIG. 3 further comprises an antireflection film 12 between a light shielding pattern 5 and a high reflection film in correspondence to the light shielding pattern 5. The antireflection film 12 is formed of chromium oxide, for example, and its refractive index $n_5$ is about 1.4. Refractive indices $n_2$, $n_5$ and $n_6$ of the high reflection film 10, the antireflection film 12 and the light shielding pattern 5 are in relations of $n_2 < n_5 < n_6$, and hence an excellent antireflection effect can be attained by setting the thickness $d_5$ of the antireflection film 12, for example, as follows:

$$d_5 = \frac{\lambda}{4n_5}$$

If this antireflection film 12 is not provided, part of the light reflected by the boundary surface between the high reflection film 10 and the light shielding pattern 5 is multiple-reflected in the high reflection film and thereafter is output toward the lens system 6 as stray light. The antireflection film 12 prevents generation of such stray light, thereby improving exposure accuracy.

Figure 4:
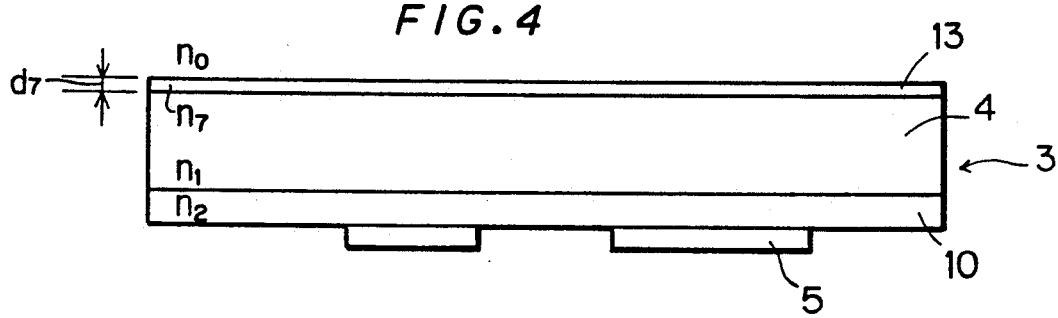

A photomask 3 shown in FIG. 4 further comprises an antireflection film 13 on another major surface of a transparent substrate 4. The antireflection film 13 is formed of $MgF_2$, for example, and its refractive index $n_7$ is 1.378. Refractive indices $n_0$, $n_7$ and $n_1$ of an air layer, the antireflection film 13 and the transparent substrate 4 are in relations of $n_0 < n_7 < n_1$, and hence an excellent antireflection effect can be attained by setting the thickness $d_7$ of the antireflection film 13, for example, as follows:

$$d_7 = \frac{\lambda}{4n_7}$$

If this antireflection film 13 is not provided, part of the light incident upon the photomask 3 from a light source 1 is reflected by the upper surface of the transparent substrate 4 to become stray light, or part of the incident light reflected by the lower surface of the transparent substrate 4 is again reflected by the upper surface of the transparent substrate 4 to become stray light and is output toward a lens system 6. The antireflection film 13 prevents generation of such stray light, thereby improving exposure accuracy.

Figure 5:
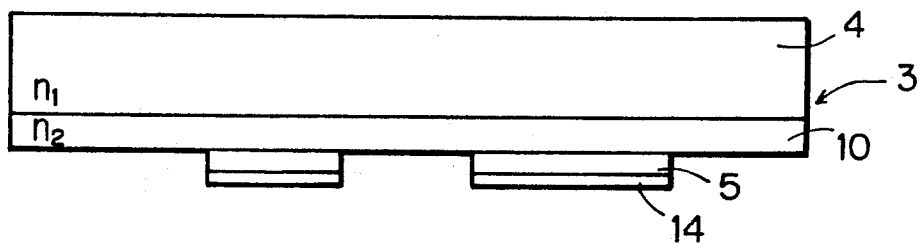

A photomask 3 shown in FIG. 5 is further provided with an antireflection film 14, which is formed of chromium oxide or the like, for example, on a surface of a light shielding pattern 5 closer to a projecting lens 6. This antireflection film 14 prevents reflection of light which is incident upon the lower surface side of the light shielding pattern 5, thereby improving exposure accuracy.

Figure 6:
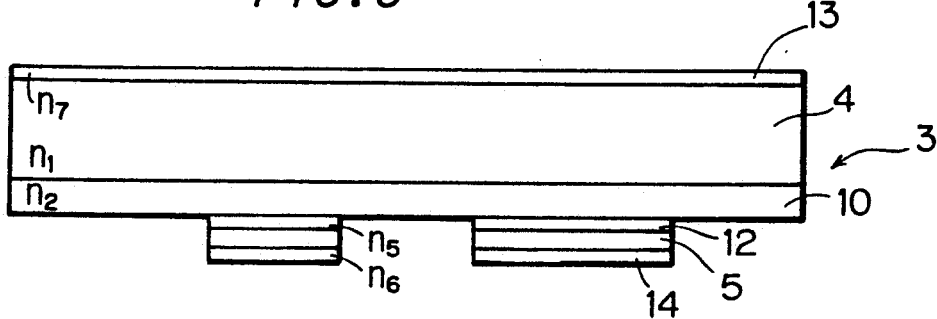

The antireflection films 12, 13 and 14 shown in FIGS. 3 to 5 may be formed in a photomask 3 in appropriate combination, as a matter of course. FIG. 6 shows an exemplary photomask 3, which comprises all of the aforementioned antireflection films 12, 13 and 14.

Figure 7:
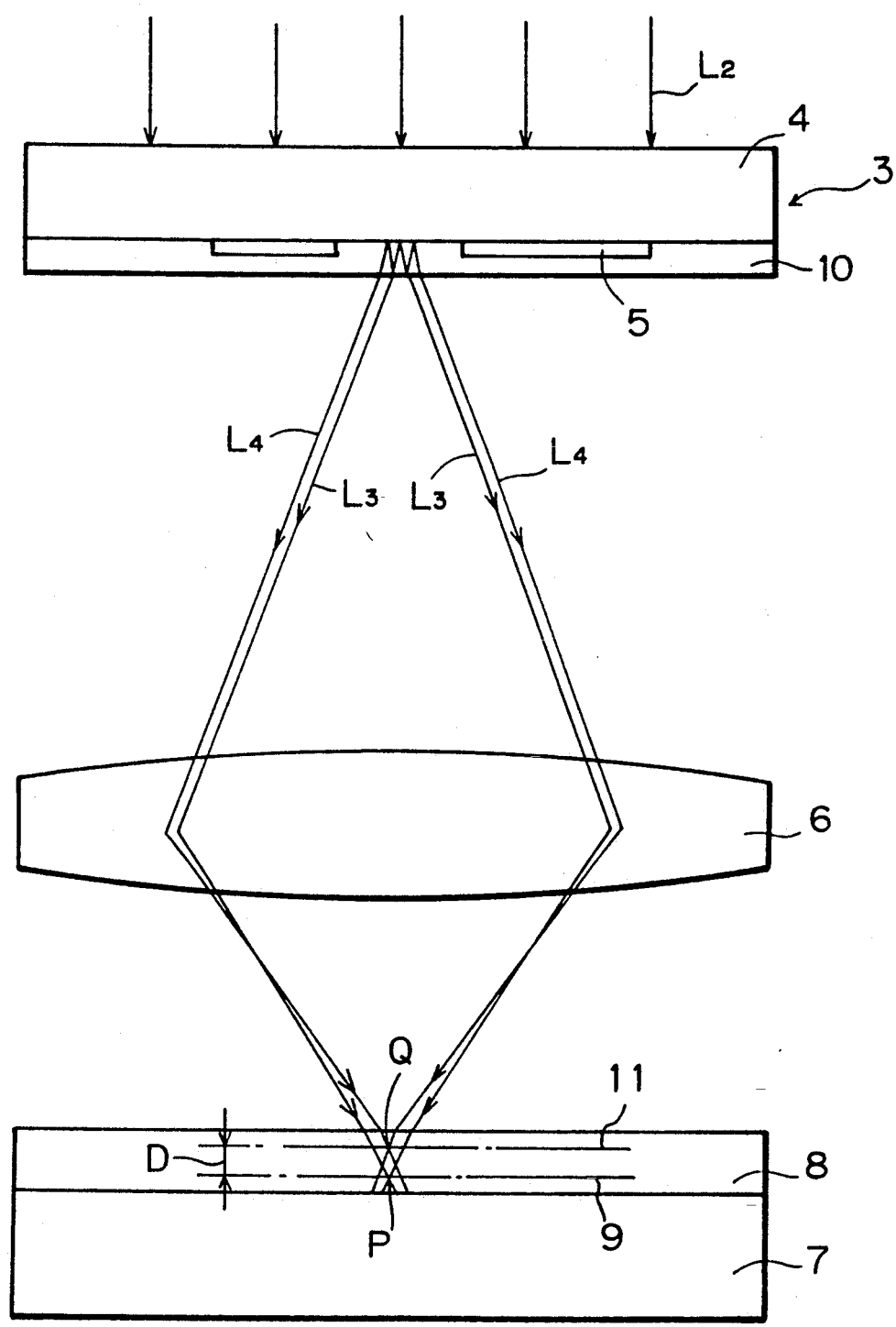
FIG. 7 is a block diagram showing an essential part of an exposure apparatus including a photomask according to a second embodiment of the present invention.

FIG. 7 is a block diagram showing an essential part of an exposure apparatus including a photomask according to a second embodiment of the present invention.

In this photomask 3, a light shielding pattern 5 is formed on one major surface of a transparent substrate 4, and a high reflection film 10 is formed on one major surface of the transparent substrate 4 to cover the light shielding pattern 5, as shown in FIG. 7. Other structure is identical to the first embodiment shown in FIG. 1, and hence the same or corresponding parts are indicated by the same reference numerals, to omit redundant description.

Also when this photomask 3 is employed, a focal position in a resist film 8 with respect to light $L_3$ directly transmitted through the high reflection film 10 is separated from a focal position Q in the resist film 8 with respect to primary reflected light $L_4$ by the high reflection film 10 along the thickness direction of the resist film 8, whereby the depth of focus is enlarged.

Figure 8:
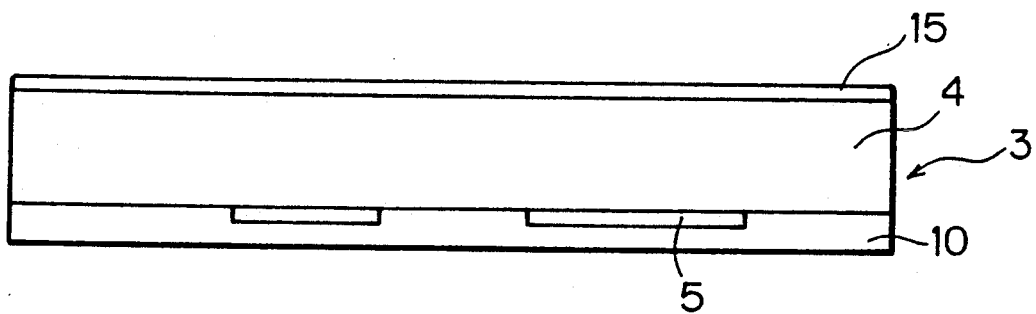
FIG. 8 is illustrative of a modification of the photomask according to the second embodiment.

FIG. 8 shows such an example that an antireflection film 15 is formed on the other major surface of the transparent substrate 4 in the aforementioned second embodiment. This antireflection film 15 has a similar function as the antireflection film 13 shown in FIG. 4.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photomask incorporated in an exposure apparatus which has a light source for illuminating said photomask and a lens system for converging a light passed through said photomask onto a resist film provided on a workpiece, said photomask comprising:
   a transparent substrate;
   a light shielding pattern formed at one major surface side of said transparent substrate; and
   a high reflection film formed at one major surface side of said transparent substrate for multiple-reflecting part of light passing between adjacent regions of said light shielding pattern,
   the following conditions being satisfied;

$$d_2 = \frac{n_4 D}{2 n_2 m^2}$$

$$D \lesssim DOF$$

where $d_2$ and $n_2$ represent, respectively, a thickness and a refractive index of said high reflection film, $n_4$ represents a refractive index of said resist film, m represents a magnification of said lens system, DOF represents a depth of focus of said lens system with respect to transmitted light through said high refection film, and D represents a distance between respective focal points of said lens system with respect to said directly transmitted light through said high reflection film and primary reflected light by said high reflection film.

2. A photomask in accordance with claim 1, wherein said high reflection film is formed on one major surface of said transparent substrate, and said light shielding pattern is formed on said high reflection film.

3. A photomask in accordance with claim 2, wherein an antireflection film is further formed on said light shielding pattern.

4. A photomask in accordance with claim 3, wherein said antireflection film is formed of chromium oxide.

5. A photomask in accordance with claim 2, wherein an antireflection film is further formed between said light shielding pattern and said high reflection film, said antireflection film having the same form as said light shielding pattern.

6. A photomask in accordance with claim 5, wherein said antireflection film is formed of chromium oxide.

7. A photomask in accordance with claim 1, wherein said light shielding pattern in formed on one major surface of said transparent substrate, and said high reflection film is formed on one major surface of said transparent substrate to cover said light shielding pattern.

8. A photomask in accordance with any of claim 1, 2 or 7, wherein said transparent substrate is formed of quartz, and said high reflection film is formed of lead glass.

9. A photomask in accordance with any of claims 1, 2 or 7, wherein an antireflection film is further formed on the other major surface of said transparent substrate.

10. A photomask in accordance with claim 9, wherein said antireflection film is formed of $MgF_2$.

11. A photomask incorporated in an exposure apparatus which has a light source for illuminating said photomask and a lens system for converging a light passed through said photomask onto a resist film provided on a workpiece, said photomask comprising:
a transparent substrate;
a light shielding pattern formed at one major surface side of said transparent substrate; and
a high reflection film formed entirely over one major surface side of said transparent substrate, for multiple-reflecting part of light passing between adjacent regions of said light shielding pattern,
the following conditions being satisfied;

$$d_2 = \frac{n_4 D}{2n_2 m^2}$$

$$D \leq DOF$$

where $d_2$ and $n_2$ represent, respectively, a thickness and a refractive index of said high refection film, $n_4$ represents a refractive index of said resist film, m represents a magnification of said lens system, DOF represents a depth of focus of said lens system with respect to transmitted light through said high reflection film, and D represents a distance between respective focal points of said lens system with respect to said directly transmitted light through said high reflection film and primary reflected light by said high reflection film.

12. The photomask in accordance with claim 11, wherein said high reflection film is formed on one major surface of said transparent substrate, and said light shielding pattern is formed on said high reflection film.

13. The photomask in accordance with claim 12, wherein an antireflection film is further formed on said light shielding pattern.

14. The photomask in accordance with claim 13, wherein said antireflection film is formed of chromium oxide.

15. The photomask in accordance with claim 12, wherein an antireflection film is further formed between said light shielding pattern and said high reflection film in correspondence to said light shielding pattern.

16. The photomask in accordance with claim 15, wherein said antireflection film is formed on chromium oxide.

17. The photomask in accordance with claim 11, wherein said light shielding pattern is formed on one major surface of said transparent substrate, and said high reflection film is formed on one major surface of said transparent substrate to cover said light shielding pattern.

18. The photomask in accordance with any of claims 11, 12 or 17, wherein said transparent substrate is formed of quartz, and said high reflection film is fomred of lead glass.

19. The photomask in accordance with any one of claims 11, 12 or 17, wherein an antireflection film is further formed on the other major surface of said transparent substrate.

20. The photomask in accordance with claim 19, wherein said antireflection film is formed of $MgF_2$.

* * * * *